(12) United States Patent
Huang et al.

(10) Patent No.: US 9,287,394 B2
(45) Date of Patent: Mar. 15, 2016

(54) LATERAL DOUBLE DIFFUSED METAL OXIDE SEMICONDUCTOR DEVICE AND MANUFACTURING METHOD THEREOF

(71) Applicants: Tsung-Yi Huang, Hsinchu (TW); Ching-Yao Yang, Changhua (TW); Wen-Yi Liao, Hsinchu (TW); Hung-Der Su, Pingzhen (TW); Kuo-Cheng Chang, New Taipei (TW)

(72) Inventors: Tsung-Yi Huang, Hsinchu (TW); Ching-Yao Yang, Changhua (TW); Wen-Yi Liao, Hsinchu (TW); Hung-Der Su, Pingzhen (TW); Kuo-Cheng Chang, New Taipei (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 14/510,600

(22) Filed: Oct. 9, 2014

(65) Prior Publication Data

US 2015/0137232 A1 May 21, 2015

(30) Foreign Application Priority Data

Nov. 15, 2013 (TW) .............................. 102141562 A

(51) Int. Cl.
*H01L 29/78* (2006.01)
*H01L 29/06* (2006.01)
*H01L 29/66* (2006.01)
*H01L 21/762* (2006.01)

(52) U.S. Cl.
CPC ...... *H01L 29/7816* (2013.01); *H01L 21/76202* (2013.01); *H01L 21/76229* (2013.01); *H01L 29/0649* (2013.01); *H01L 29/6681* (2013.01)

(58) Field of Classification Search
CPC ..................... H01L 29/7816; H01L 21/76205; H01L 29/6681; H01L 29/0649; H01L 29/66681; H01L 29/66689
See application file for complete search history.

(56) References Cited

U.S. PATENT DOCUMENTS

| 2009/0072308 | A1* | 3/2009 | Chen et al. | 257/336 |
| 2009/0166736 | A1* | 7/2009 | Park | 257/343 |
| 2010/0102388 | A1* | 4/2010 | Levin et al. | 257/343 |

* cited by examiner

*Primary Examiner* — Ermias Woldegeorgis
(74) *Attorney, Agent, or Firm* — Tung & Associates

(57) ABSTRACT

The present invention discloses a lateral double diffused metal oxide semiconductor (LDMOS) device and a manufacturing method thereof. The LDMOS device includes: drift region, an isolation oxide region, a first oxide region, a second oxide region, a gate, a body region, a source, and a drain. The isolation oxide region, the first oxide region, and the second oxide region have an isolation thickness, a first thickness, and a second thickness respectively, wherein the second thickness is less than the first thickness. The present invention can reduce a conduction resistance without decreasing a breakdown voltage of the LDMOS device by the first oxidation region and the second oxidation region.

1 Claim, 13 Drawing Sheets

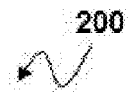
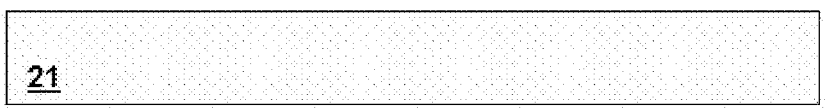
Fig. 2A
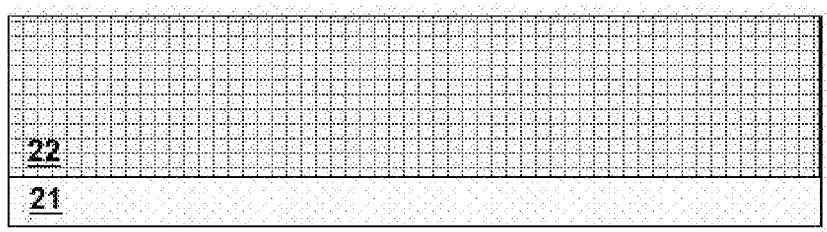
Fig. 2B
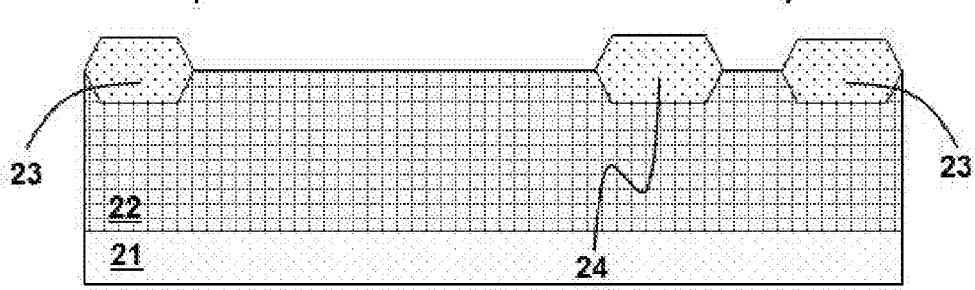
Fig. 2C
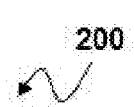
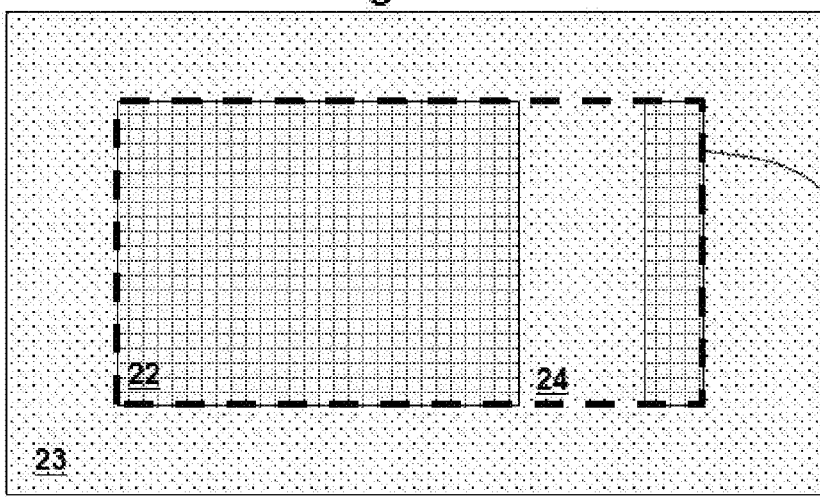
Fig. 2D

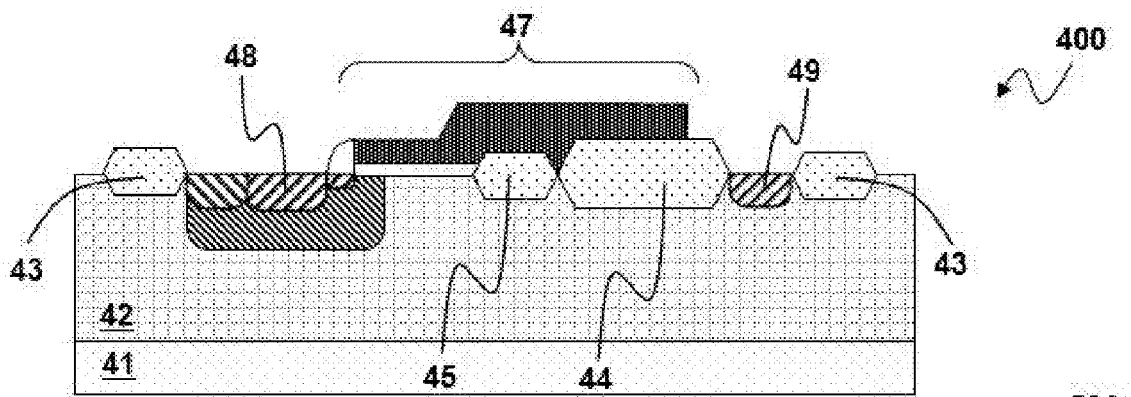
Fig. 4F
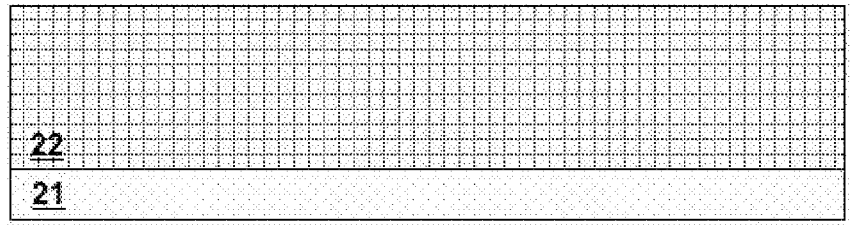
Fig. 5A
Fig. 5B
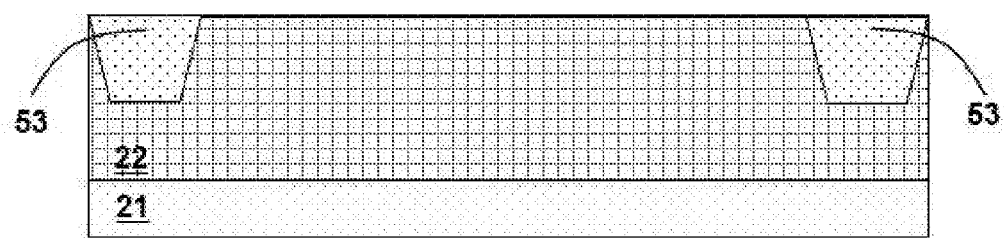
Fig. 5C

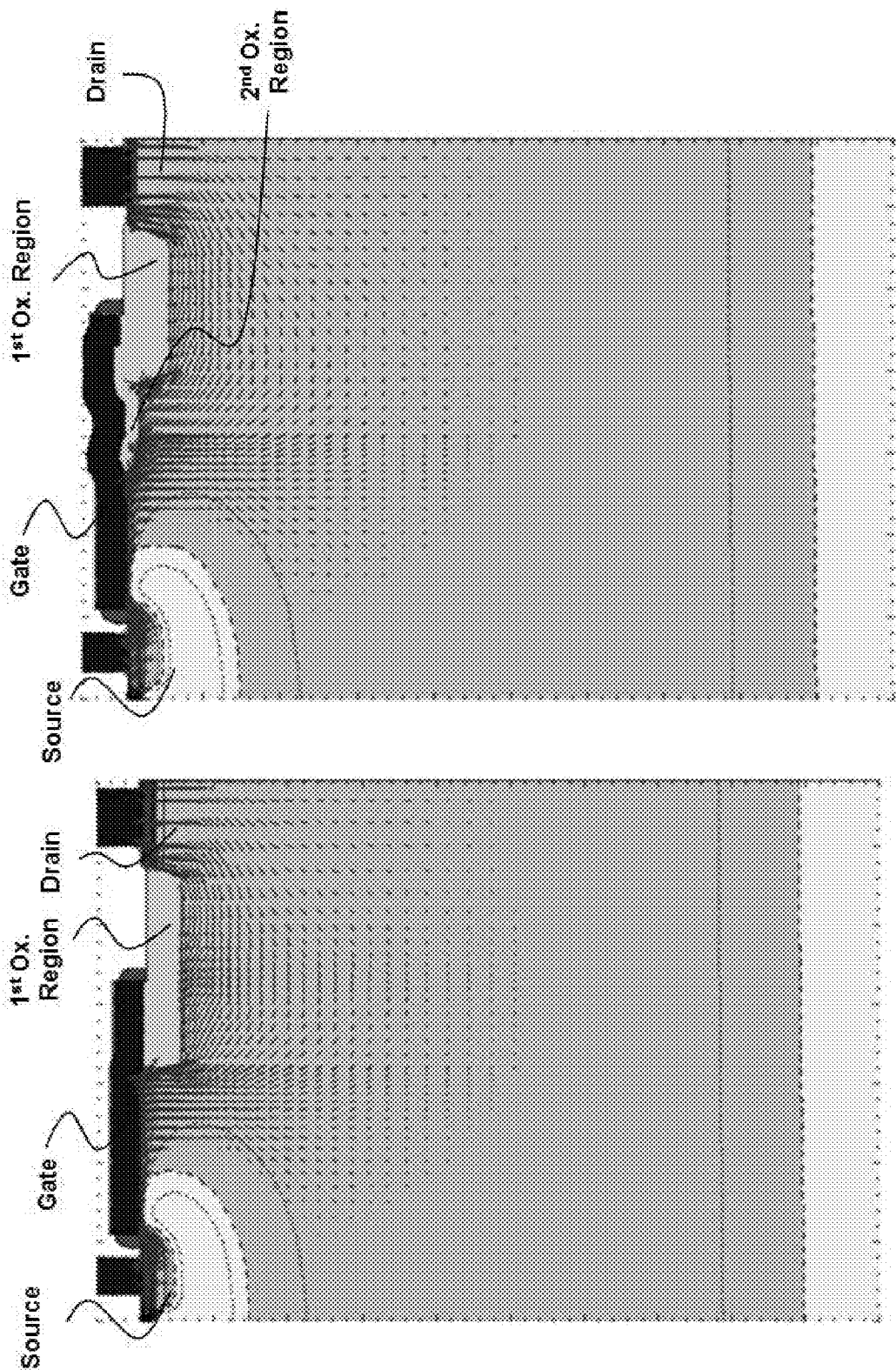

US 9,287,394 B2

LATERAL DOUBLE DIFFUSED METAL OXIDE SEMICONDUCTOR DEVICE AND MANUFACTURING METHOD THEREOF

CROSS REFERENCE

The present invention claims priority to TW 102141562, filed on Nov. 15, 2013.

BACKGROUND OF THE INVENTION

1. Field of Invention

The present invention relates to a lateral double diffused metal oxide semiconductor (LDMOS) device and a manufacturing method thereof; particularly, it relates to such LDMOS device and manufacturing method thereof wherein a conduction resistance is reduced without decreasing a breakdown voltage.

2. Description of Related Art

FIGS. 1A and 1B are schematic diagrams showing a cross-section view and a top view of a prior art lateral double diffused metal oxide semiconductor (LDMOS) device 100 respectively. As shown in FIGS. 1A and 1B, the LDMOS device 100 includes: a drift region 12, an isolation oxide region 13, a first oxide region 14, a body region 16, a gate 17, a source 18, and a drain 19. The drift region 12 is formed on a substrate 11, and has an N-type conductivity. The isolation oxide region 13 is formed by local oxidation of silicon (LOCOS) structure; the isolation oxide region 13 defines an operation region 13a for the LDMOS device 100. The operation region 13a is indicated by a bold dashed frame as shown in FIG. 1B. The gate 17 overlays part of the first oxide region 14. In this prior art, in order to increase the withstand voltage or breakdown voltage of the LDMOS device 100, the thickness of the isolation oxide region 13 and the first oxide region 14 is increased. However, this will increase the conduction resistance of the LDMOS device 100, and therefore decrease the operation speed and the performance of the LDMOS device 100.

In view of the above, to overcome the drawbacks in the prior art, the present invention proposes an LDMOS device and a manufacturing method thereof, which reduces the conduction resistance of the LDMOS device without decreasing its breakdown voltage.

SUMMARY OF THE INVENTION

The present invention provides a lateral double diffused metal oxide semiconductor (LDMOS) device, including: a drift region with a first conductive type, which is formed on a substrate; an isolation oxide region, which is formed on the drift region to define an operation region; a first oxide region, which is formed on the drift region in the operation region; a second oxide region, which is formed on the drift region in the operation region, and is directly connected to the first oxide region in a lateral direction; a gate, which is formed on the drift region within the operation region from a top view, and overlays at least part of the second oxide region and part of the first oxide region, the gate including: a dielectric layer, which is formed on the drift region, and is directly connected to the second oxide region in the lateral direction, wherein the second oxide region separates the dielectric layer and the first oxide region from each other; a stack layer, which is formed on the dielectric layer; and a spacer layer, which is formed over a side wall of the stack layer; a body region with a second conductive type, which is formed in the drift region, and part of the body region is beneath the gate; a source with the first conductive type, which is formed in the body region, wherein the spacer layer is located between the source and the stack layer from the top view; and a drain with the first conductive type, which is formed in the drift region, and the drain is located between the first oxide region and the isolation oxide region; wherein the first oxide region has a first thickness and the second oxide region has a second thickness, and the second thickness is less than the first thickness.

The present invention also provides a manufacturing method of a lateral double diffused metal oxide semiconductor (LDMOS) device, including: providing a substrate; forming with a first conductive type a drift region on the substrate; forming an isolation oxide region on the drift region to define an operation region; forming a first oxide region on the drift region in the operation region; forming a second oxide region on the drift region in the operation region, which is directly connected to the first oxide region in a lateral direction; forming a gate on the drift region in the operation region, which overlays at least part of the second oxide region and part of the first oxide region, including: forming a dielectric layer on the drift region, which is directly connected to the second oxide region in the lateral direction, wherein the second oxide region separates the dielectric layer and the first oxide region from each other; forming a stack layer on the dielectric layer; and forming a spacer layer over a side wall of the stack layer; forming a body region with a second conductive type in the drift region, and part of the body region is beneath the gate; forming a source with the first conductive type in the body region, wherein the spacer layer is located between the source and the stack layer from a top view; and forming a drain with the first conductive type in the drift region, which is located between the first oxide region and the isolation oxide region; wherein the first oxide region has a first thickness and the second oxide region has a second thickness, and the second thickness is less than the first thickness.

In one preferable embodiment, the isolation oxide region has a third thickness and the first thickness is larger than the third thickness, and wherein the isolation oxide region, the first oxide region, and the second oxide region are all local oxidation of silicon (LOCOS) structures.

In another preferable embodiment, one or more of the isolation oxide region, the first oxide region, and the second oxide region are shallow trench isolation (STI) structures.

In one preferable embodiment, the isolation oxide region, the drain, the first oxide region, the second oxide region, and the dielectric layer are sequentially connected in the lateral direction.

In one preferable embodiment, the LDMOS device further includes a body electrode with the second conductive type, which is formed in the body region as an electrical contact of the body region.

The present invention also provides a lateral double diffused metal oxide semiconductor (LDMOS) device, including: a drift region with a first conductive type, which is formed on a substrate; an isolation oxide region, which is formed on the drift region to define an operation region; a first oxide region, which is formed on the drift region in the operation region; a gate, which is formed on the drift region within the operation region, and overlays part of the first oxide region, the gate including: a dielectric layer, which is formed on the drift region, and is connected to the first oxide region in the lateral direction; a stack layer, which is formed on the dielectric layer; and a spacer layer, which is formed over a side wall of the stack layer; a body region, which is formed in the drift region with the second conductive type, and part of the body region is beneath the gate; a source, which is formed in the body region with the first conductive type, wherein the spacer layer is located between the source and the stack layer from a top view; and a drain, which is formed in the drift region, and the drain is located between the first oxide region and the isolation oxide region; wherein the isolation oxide region and the first oxide region are shallow trench isolation (STI) structures, the isolation oxide region having an isolation thickness and the first oxide region having a first thickness respectively, wherein the first thickness is less than the isolation thickness.

The objectives, technical details, features, and effects of the present invention will be better understood with regard to the detailed description of the embodiments below.

BRIEF DESCRIPTION OF THE DRAWINGS

FIGS. 2A-2J show a first embodiment of the present invention.

FIGS. 4A-4F show a third embodiment of the present invention.

FIGS. 5A-5F show a fourth embodiment of the present invention.

FIGS. 12A-12B show current vector simulation diagrams of the prior art LDMOS device and the LDMOS device according to the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2E:
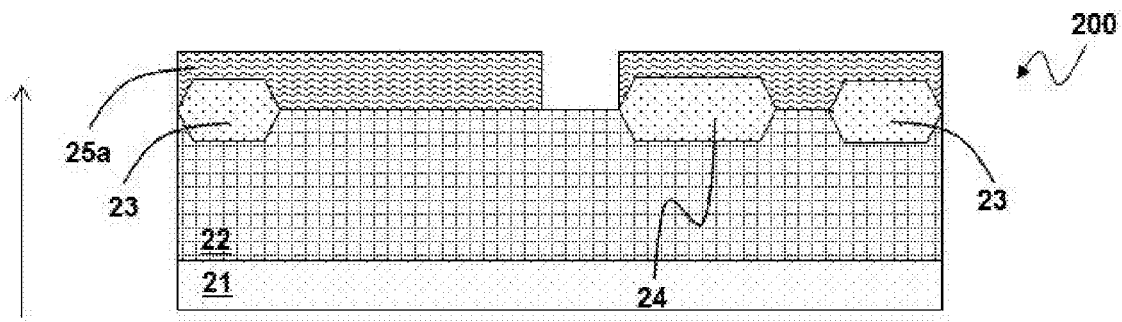
Figure 2F:
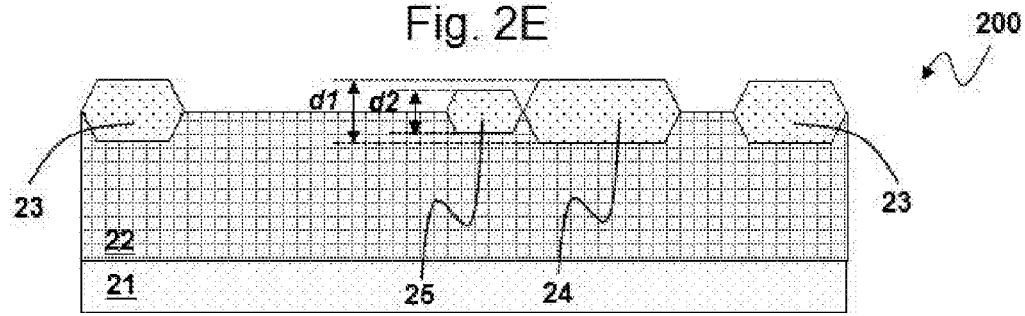
Figure 2G:
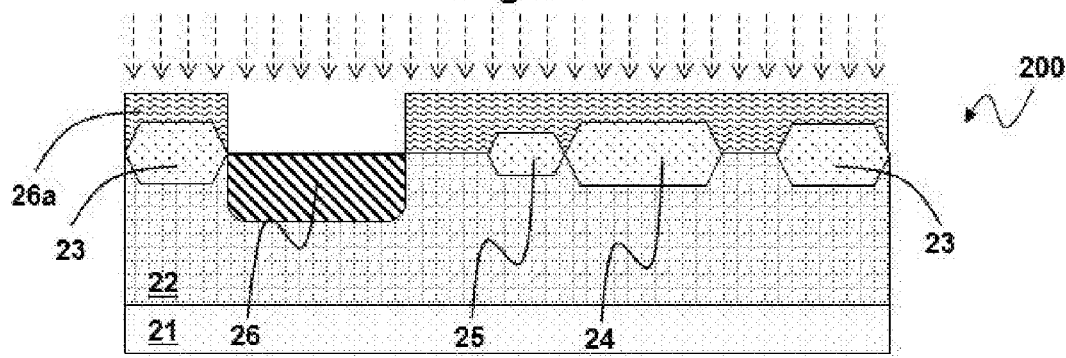
Figure 2H:
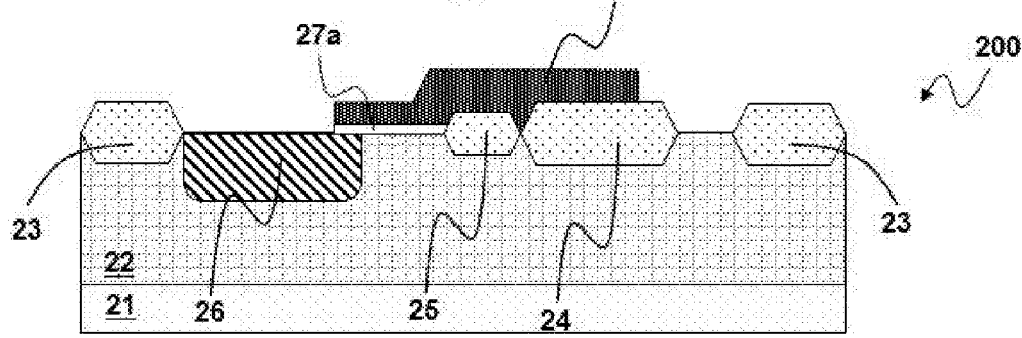
Figure 2I:
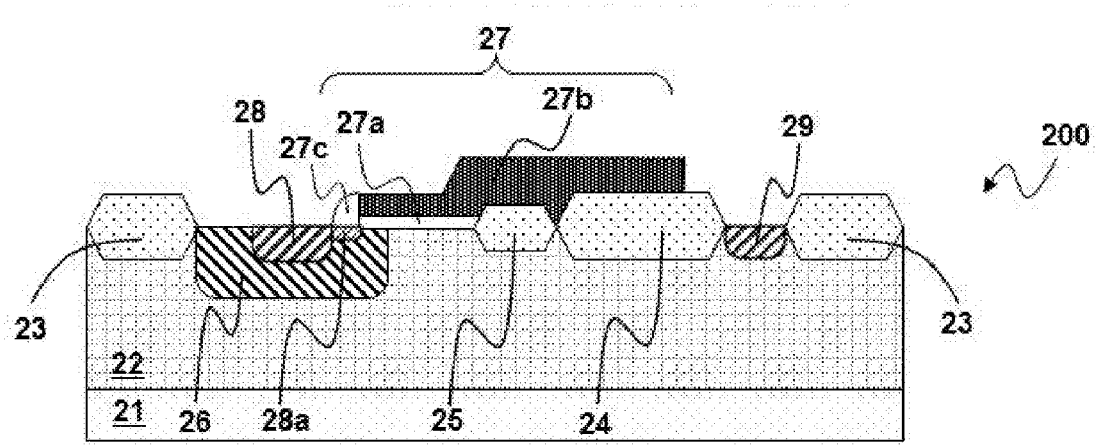
Figure 2J:
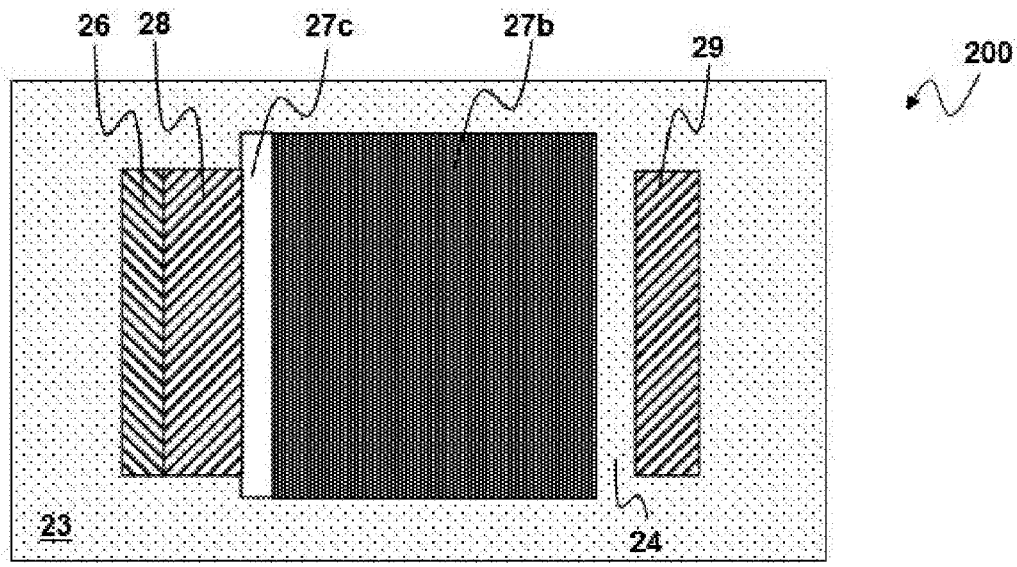

Please refer to FIGS. 2A-2J for a first embodiment according to the present invention, wherein FIGS. 2A-2C and FIGS. 2E-2I are schematic diagrams showing a manufacturing method of an LDMOS device 200 from a cross-section view, and FIGS. 2D and 2J show top views of FIGS. 2C and 2I respectively. As shown in FIG. 2A, a substrate 21, for example but not limited to a P-type silicon substrate, is provided. Next, as shown in FIG. 2B, a drift region 22 is formed on the substrate 21. The drift region 22 is for example but not limited to an N-type epitaxial layer formed on the substrate 21. Next, referring to FIG. 2C, an isolation oxide region 23 and a first oxide region 24 are formed on the drift region 22. The isolation oxide region 23 defines an operation region 23a of the LDMOS device 200, wherein the operation region 23a is located in the drift region 22 as indicated by the dashed bold frame shown in FIG. 2D. The isolation oxide region 23 and the first oxide region 24 are for example but not limited to local oxidation of silicon (LOCOS) structures, and preferably are formed by the same process steps.

Next, referring to FIG. 2E, a mask layer 25a defines a second oxide region 25, wherein the mask layer 25a is for example but not limited to a hard mask including a nitride layer (such as a silicon nitride layer) to protect regions outside the second oxide region 25 from an oxidation process. Next, as shown in FIG. 2F, after the second oxide region 25 is formed by local oxidation of silicon, the mask layer 25a may be removed. The second oxide region 25 is formed with a thickness smaller than the thickness of the first oxide region 24 ("thickness" refers to a length in the vertical direction indicated by an arrow shown in FIG. 2E), and the formation of the second oxide region 25 does not affect the thickness of the first oxide region 24. As shown in FIG. 2F, the thickness of the first oxide region 24 is d1 in the vertical direction, which is larger than the thickness d2 of the second oxide region 25 in the vertical direction. The second oxide region 25 is directly connected to the first oxide region 24 in a lateral direction as indicated by an arrow shown in FIG. 2F. Next, as shown in FIG. 2G, a photoresist mask layer 26a is formed by a lithography process, which defines a P-type body region 26, and an ion implantation process step implants P-type impurities to the defined P-type body region 26 in the form of accelerated ions as indicated by the dashed arrow lines shown in the figure to form the P-type body region 26 in the drift region 22. The photoresist mask layer 26a is removed afterward (not shown).

Next, referring to FIG. 2H, a dielectric layer 27a is formed on and connected with the drift region 22 in the vertical direction, and the dielectric layer 27a is directly connected to the second oxide region 25 in the lateral direction. The second oxide region 25 separates the dielectric layer 27a and the first oxide region 24 from each other in the lateral direction. The dielectric layer 27a has a relatively higher dielectric coefficient, i.e., the dielectric coefficient of the dielectric layer 27a is higher than that of the silicon or the material of the substrate 21. Next, a stack layer 27b is formed on the dielectric 27a as an electric contact of the gate 27 (referring to FIG. 2I). The stack layer 27b includes a conductive material such as metal or poly silicon doped with P-type or N-type impurities. The stack layer 27b overlays the dielectric layer 27a, and also overlays at least part of the second oxide region 25 and part of the first oxide region 24.

Next, referring to FIG. 2I, a lightly doped region 28a is formed in the body region 26 by using the stack layer 26b as a mask. The lightly doped region 28a has the same conductive type with the drift region 22, such as the N-type in this embodiment. Next, a spacer layer 26c is formed on sidewalls of the stack layer 26b above the drift region 22, and envelops the sidewalls of the stack layer 26b. The spacer layer 26c includes an insulating material. The spacer layer 26c can be used as a mask for forming a source 28 by a self-aligned process step. Next, the source 28 is formed in the body region 26, which has the same conductive type with the drift region 22, such as the N-type in this embodiment. The spacer layer 26c is located between the source 28 and the stack layer 26b from the top view of FIG. 2H. A drain 29 is formed in the drift region 22, which has the same conductive type with the drift region 22, such as the N-type in this embodiment. The drain 29 is located between the first oxide region 24 and the isolation oxide region 23 in the lateral direction from the cross-section view of FIG. 2I. From the top view of FIG. 2H, the isolation oxide region 23, the drain 29, the first oxide region 24, the second oxide region 25, and the dielectric layer 27a are sequentially connected from right to left in the lateral direction.

Figure 1A:
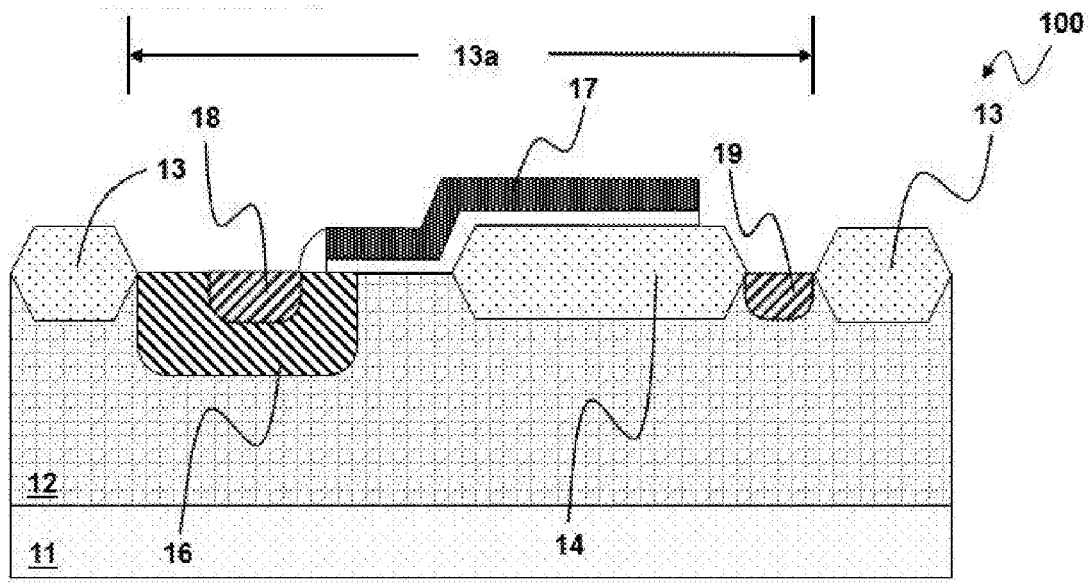
FIGS. 1A and 1B show a prior art lateral double diffused metal oxide semiconductor (LDMOS) device 100.
Figure 1B:
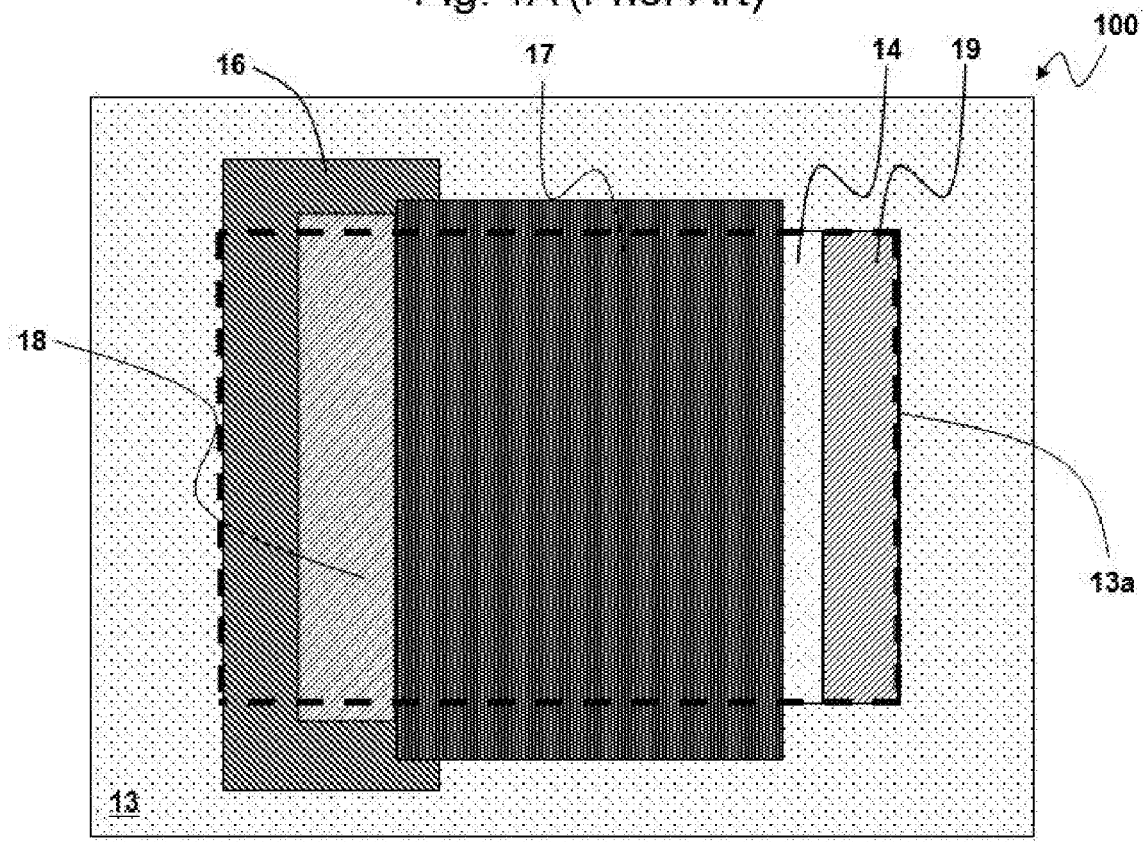

This embodiment is different from the prior art in that, in this embodiment, the relatively thinner second oxide region 25 replaces part of the first oxide region 14 near the source 19 of the prior art LDMOS device 100 shown in FIG. 1A, such that the conduction resistance is reduced whereby the conduction current and the operation speed are increased to broaden the application range of the LDMOS device without decreasing its breakdown voltage.

Figure 3A:
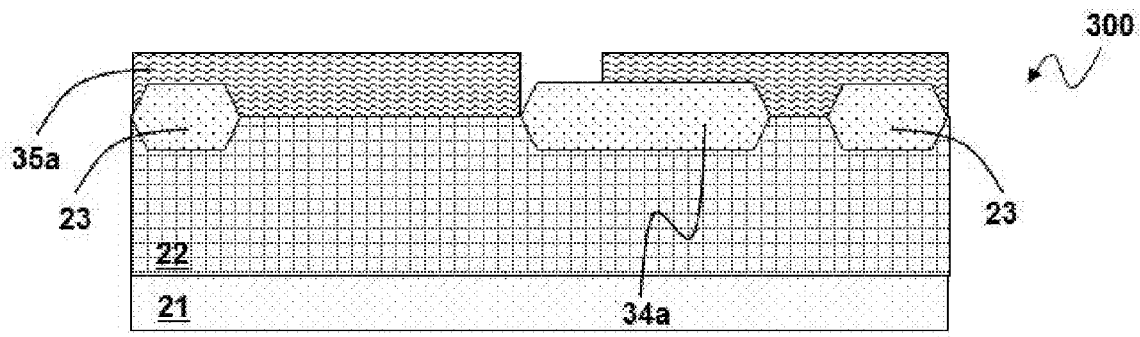
FIGS. 3A-3C show a second embodiment of the present invention.
Figure 3B:
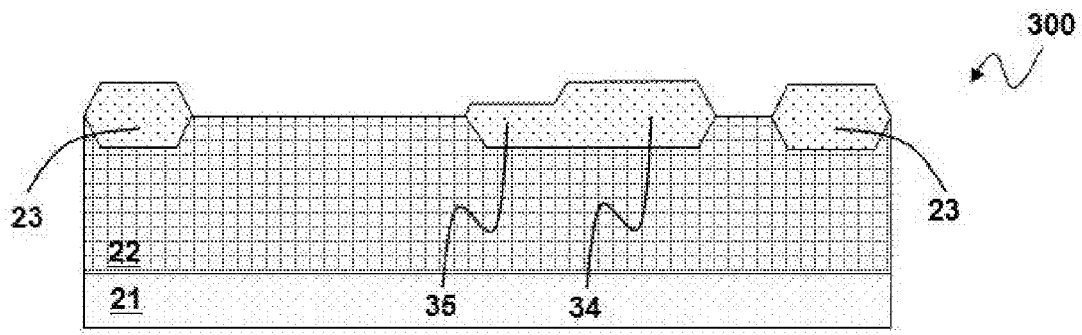
Figure 3C:
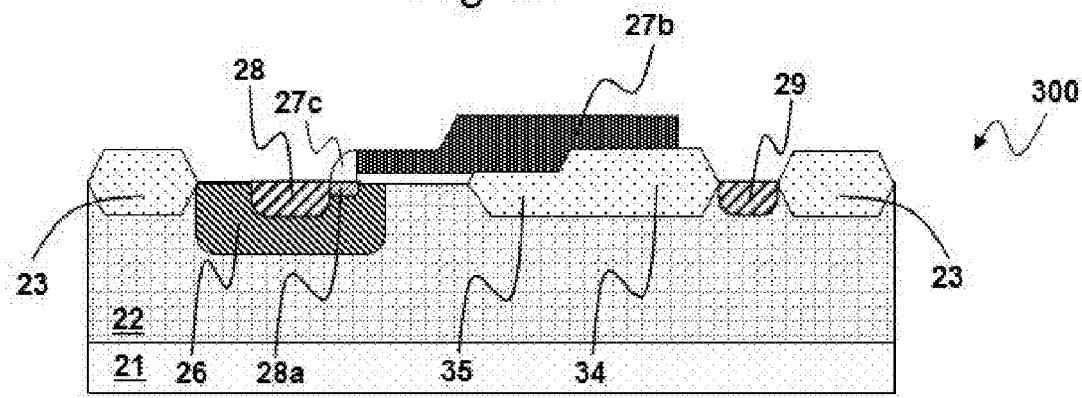

FIGS. 3A-3C show a second embodiment of the present invention. This embodiment shows a manufacturing method of an LDMOS device 300 from a cross-section view. This embodiment indicates that the method of forming the second oxide region is not limited to the method shown in the first embodiment according to the present invention. This embodiment is different from the first embodiment in that, as shown in FIG. 3A, first, an oxide region 34a is formed, and a second oxide region 35 is defined by a mask layer 35a. Next, as shown in FIG. 3B, part of the defined second oxide region 35 is removed by for example but not limited to an etching process, and the relatively thinner second oxide region 35 and a first oxide region 34 which is the remaining not-etched portion of the oxide region 34a are formed as shown in the figure. The other process steps are the same as the first embodiment, and the LDMOS device 300 is formed as shown in FIG. 3C.

In another embodiment, the method of forming the first oxide region 34 and the second oxide region 35 may include: forming a relatively thinner oxide region first, masking the second oxide region 35, and then growing the relatively thicker first oxide region 34 by LOCOS.

Figure 4A:
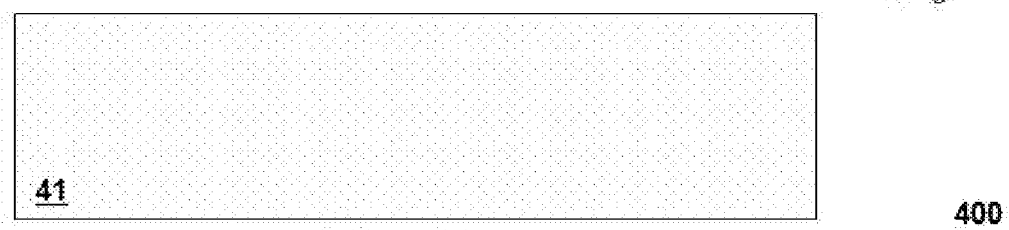
Figure 4B:
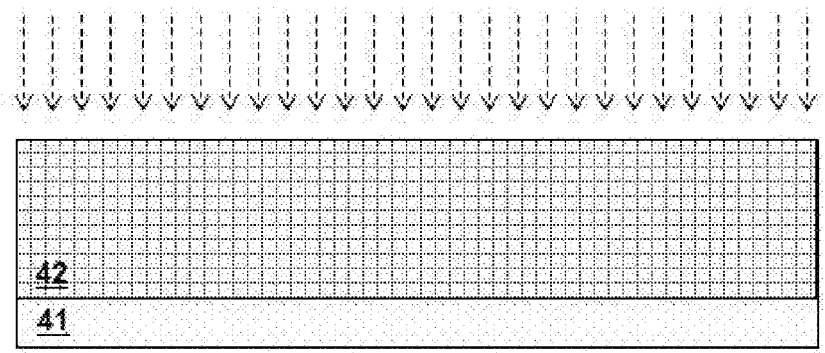
Figure 4C:
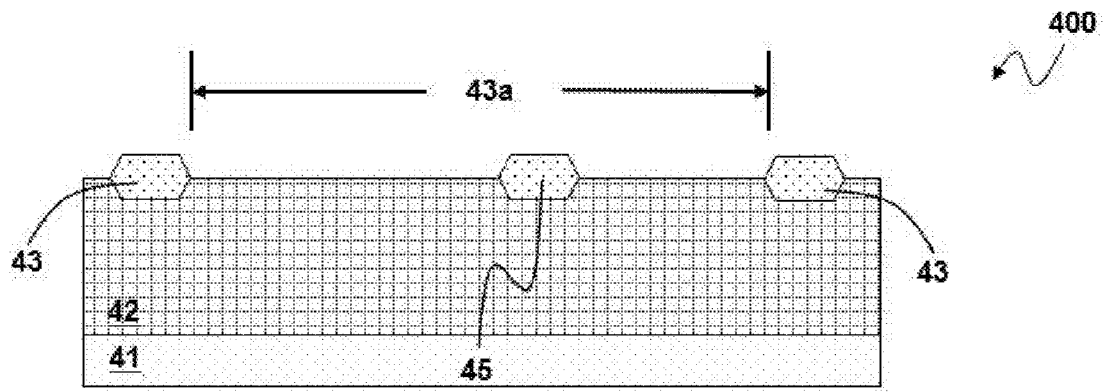

Please refer to FIGS. 4A-4F for a third embodiment according to the present invention. First, as shown in FIG. 4A, a substrate 41, for example but not limited to a P-type silicon substrate (or any other type of semiconductor substrate), is provided. Next, as shown in FIG. 4B, a drift region 42 is formed on the substrate 41. This embodiment is different from the first embodiment in that, the drift region 42 is not the N-type epitaxial layer on the substrate as shown in the first embodiment, but instead is formed for example by an ion implantation process step, which implants N-type impurities to the substrate 41 in the form of accelerated ions as indicated by the dashed arrow lines shown in FIG. 4B to form the N-type drift region 42 in the substrate 41. Next, referring to FIG. 4C, an isolation oxide region 43 and a second oxide region 45 are formed on the drift region 42 to define an operation region 43a. Here, this embodiment is also different from the first embodiment in that in this embodiment, the thickness of the isolation oxide region 43 is the same as the second oxide region 45. The isolation oxide region 43 defines the operation region 43a of the LDMOS device 400, wherein the operation region 43a is located in the drift region 42. The isolation oxide region 43 and the second oxide region 45 are for example but not limited to the LOCOS structures, and preferably are formed by the same process steps.

Figure 4D:
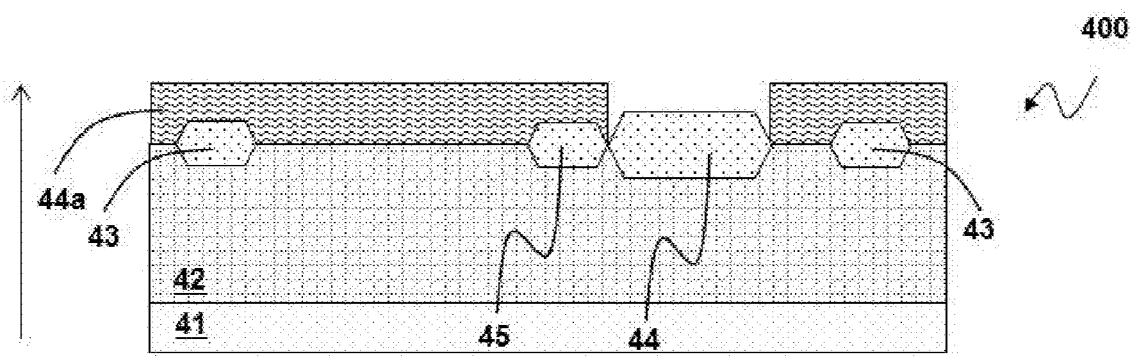
Figure 4E:
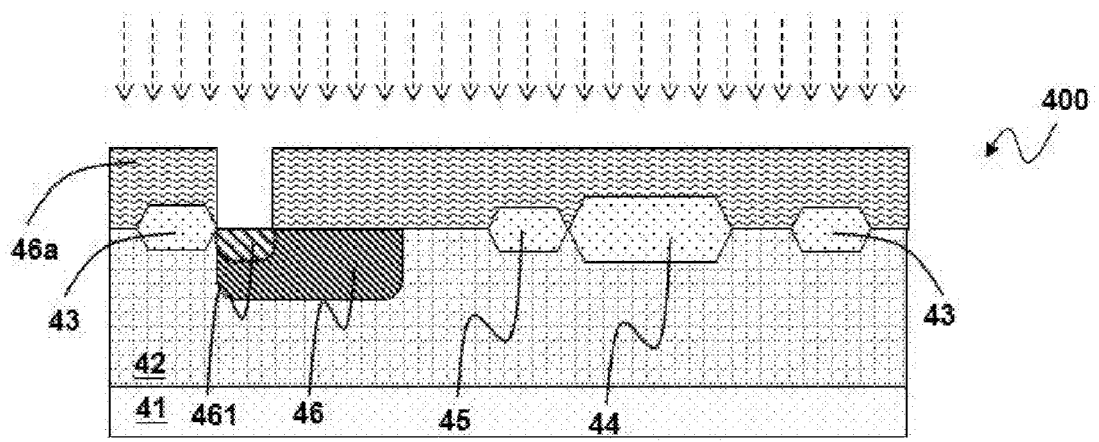

Next, referring to FIG. 4D, a mask layer 44a defines a first oxide region 44, wherein the mask layer 44 is for example but not limited to a hard mask including a nitride layer (such as a silicon nitride layer) to protect regions outside the first oxide region 44 from an oxidation process. 4D. Next, after the first oxide region 44 is formed by LOCOS, the mask layer 44a may be removed. The first oxide region 44 is formed with a thickness larger than the thickness of the second oxide region 45 in a vertical direction indicated by an arrow shown in FIG. 4D, and the formation of the first oxide region 44 does not affect the thickness of the second oxide region 45. Alternatively, the process steps for forming the first oxide region 44 may be performed earlier than the process steps for forming the isolation oxide region 43 and the second oxide region 45. The second oxide region 45 is directly connected to the first oxide region 44 in the lateral direction. Next, a P-type body region 46 is formed as shown in FIG. 4E by the same process steps of the first embodiment. Next, as shown in FIG. 4E, a photoresist mask layer 46a is formed by a lithography process, which defines a P-type body electrode 461, and an ion implantation process step implants P-type impurities to the defined P-type body electrode 461 in the form of accelerated ions as indicated by the dashed arrow lines shown in the figure to form the P-type body electrode 461 in the body region 46 as the electric contact of the body region 46. The photoresist mask layer 46a is removed afterward (not shown). Next, as shown in FIG. 4F, a gate 46, a source 48, and a drain 49 are formed by the same process steps of the first embodiment. The source 48 and the drain 49 have the same conductive type with the drift region 42, such as the N-type in this embodiment.

Figure 5D:
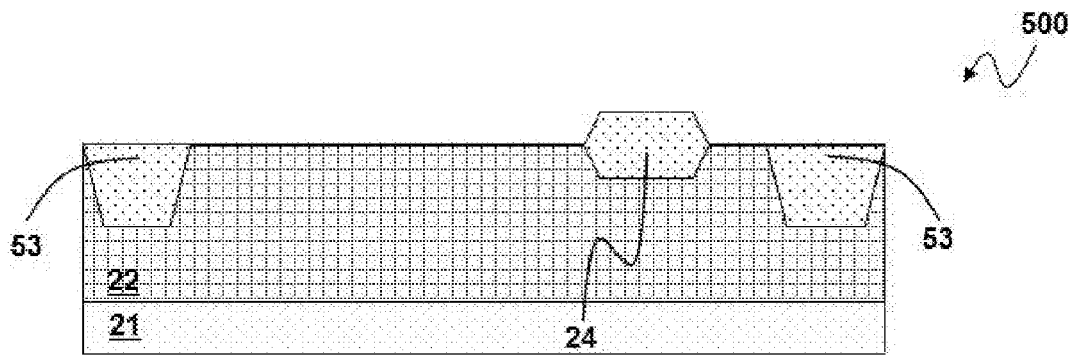

Please refer to FIGS. 5A-5F for a fourth embodiment according to the present invention. This embodiment shows a manufacturing method of an LDMOS device 500 from a cross-section view. First, as shown in FIG. 5A, the substrate 21 is provided. Next, as shown in FIG. 5B, the drift region 22 is formed on the substrate 21. Next, as shown in FIG. 5C, an isolation oxide region 53 is formed on the drift region 22 to define an operation region 53a of the LDMOS device 500. The operation region 53a is located in the drift region 22. This embodiment is different from the first embodiment in that, in this embodiment, the isolation oxide region 53 is a shallow trench isolation (STI) structure.

Figure 5E:
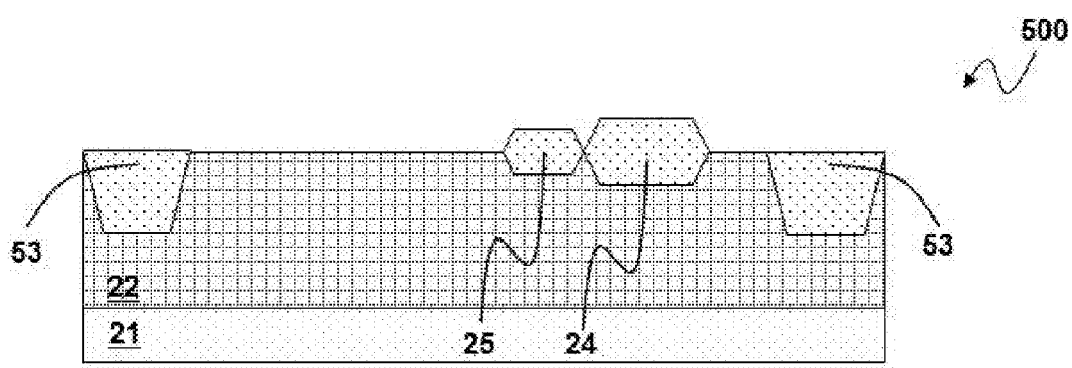
Figure 5F:
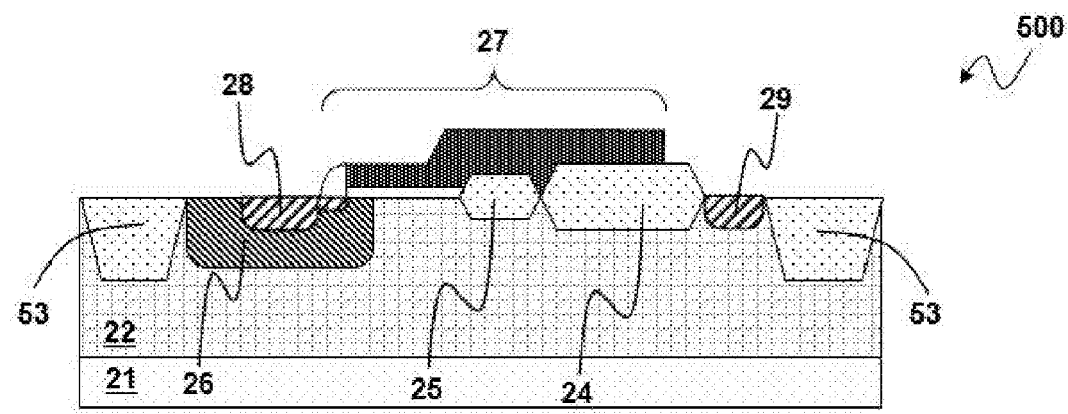

Next, the same as the first embodiment, as shown in FIG. 5D, the first oxide region 24 is formed on the drift region 22. Next, as shown in FIG. 5E, the second oxide region 25 is formed, wherein the second oxide region 25 is thinner than the first oxide region 24 in the vertical direction. Next, the same as the first embodiment, the body region 26, the gate 27, the source 28, and the drain 29 are formed as shown in FIG. 5F.

Figure 6:
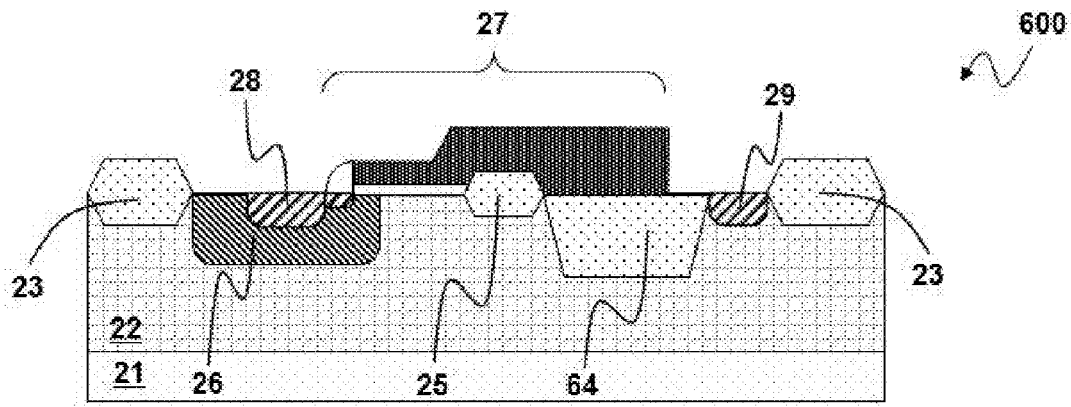
FIG. 6 shows a fifth embodiment of the present invention.

FIG. 6 shows a fifth embodiment of the present invention. This embodiment is different from the first embodiment in that, an LDMOS device 600 of this embodiment shown in the figure includes a first oxide region 64 having the STI structure instead of the LOCOS structure. This embodiment indicates that the first oxide region may be the STI structure.

Figure 7:
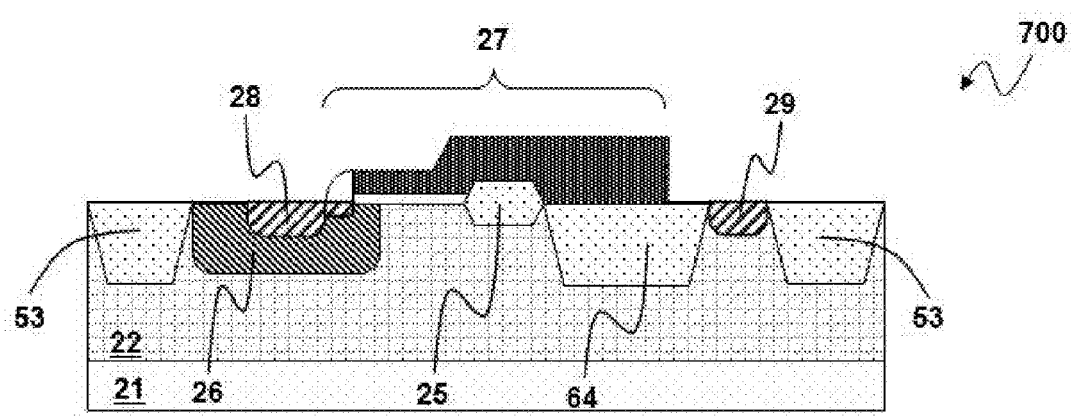
FIG. 7 shows a sixth embodiment of the present invention.

FIG. 7 shows a sixth embodiment according to the present invention. This embodiment is different from the fifth embodiment in that, an LDMOS device 700 of this embodiment shown in the figure includes an isolation oxide region 53 having the STI structure instead of the LOCOS structure. This embodiment indicates that the first oxide region and the isolation oxide region may both be the STI structures.

Figure 8:
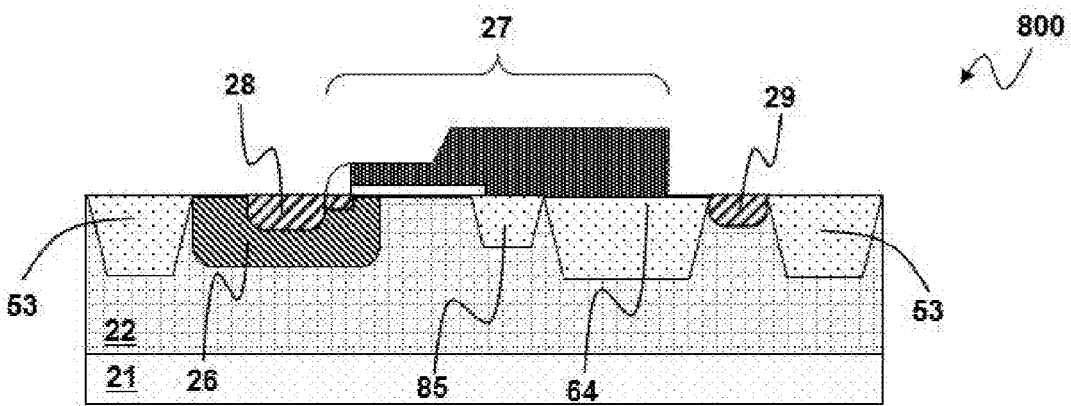
FIG. 8 shows a seventh embodiment of the present invention.

FIG. 8 shows a seventh embodiment according to the present invention. This embodiment is different from the sixth embodiment in that, an LDMOS device 800 of this embodiment shown in the figure includes a second oxide region 85 having the STI structure instead of the LOCOS structure. This embodiment indicates that the first oxide region, the second oxide region, and the isolation oxide region may all be the STI structures.

Figure 9:
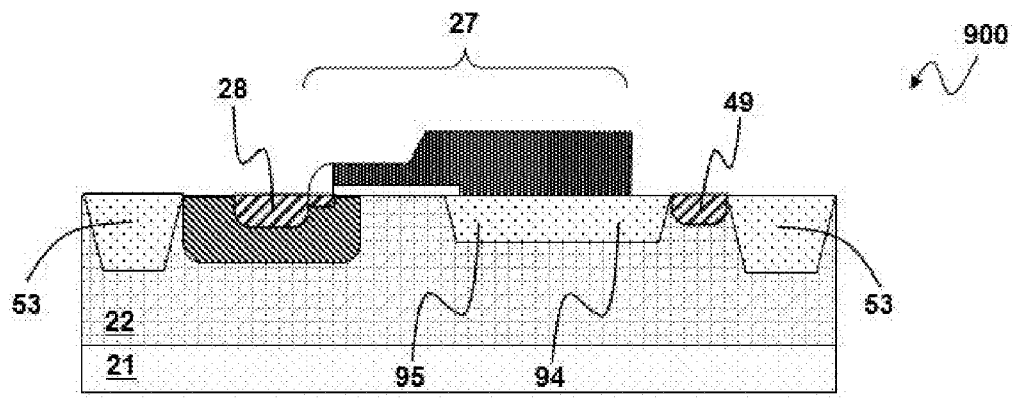
FIG. 9 shows an eighth embodiment of the present invention.

FIG. 9 shows an eighth embodiment according to the present invention. This embodiment is different from the seventh embodiment in that, an LDMOS device 900 of this embodiment shown in the figure includes a first oxide region 94 and a second oxide region 95 having the STI structures. The first oxide region 94 and the second oxide region 95 are formed by the same process steps with the same thickness which is less than that of the isolation oxide region 53 having the STI structure.

Figure 10:
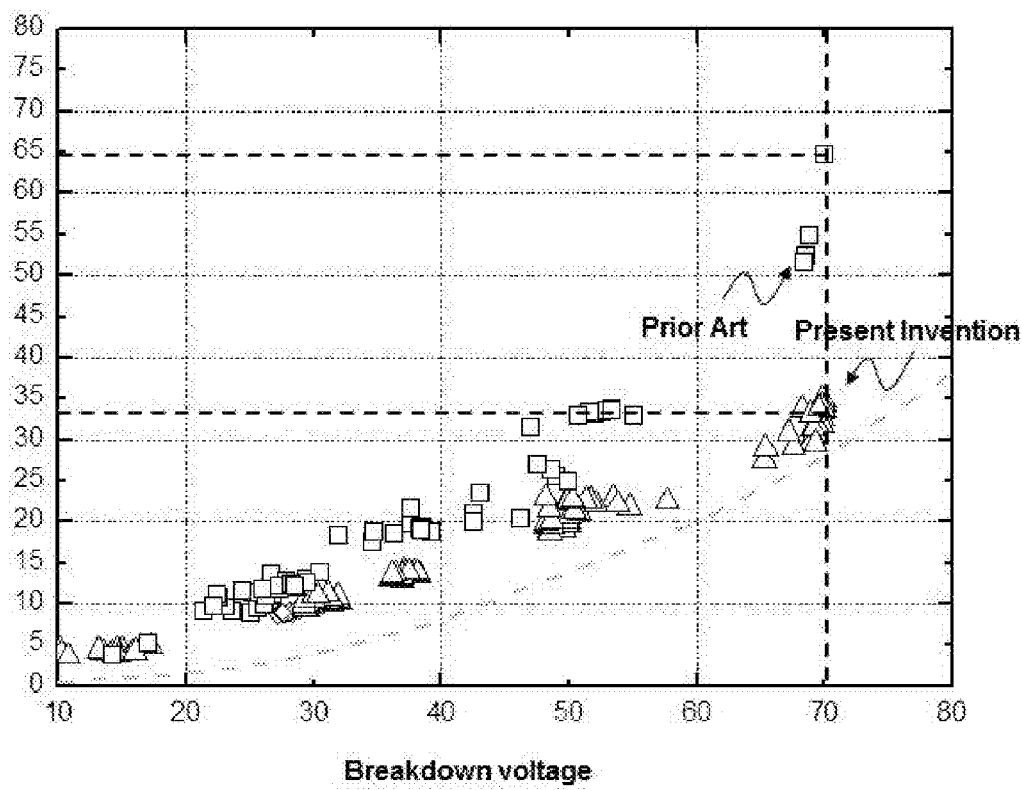
FIG. 10 show comparison of breakdown voltages and conduction resistances of the prior art LDMOS device and the LDMOS device according to the present invention.

FIG. 10 shows conduction resistance (Ron) vs. breakdown voltage (BV) characteristic curves of the LDMOS devices of the prior art and the present invention. Square symbols indicate the Ron vs. BV characteristic curve of the LDMOS device of the prior art, and triangular symbols indicate the Ron vs. BV characteristic curve of the LDMOS device of the present invention. As shown by the dash lines in FIG. 10, the Ron of the present invention is obviously lower than the Ron of the prior art with the same BV, and the BV of the present invention is obviously higher than the BV of the prior art with the same Ron. The LDMOS device according to the present invention can reduce the Ron to increase the conduction current under the same BV, and therefore the application range of the device is broader.

Figures 11A, 11B:
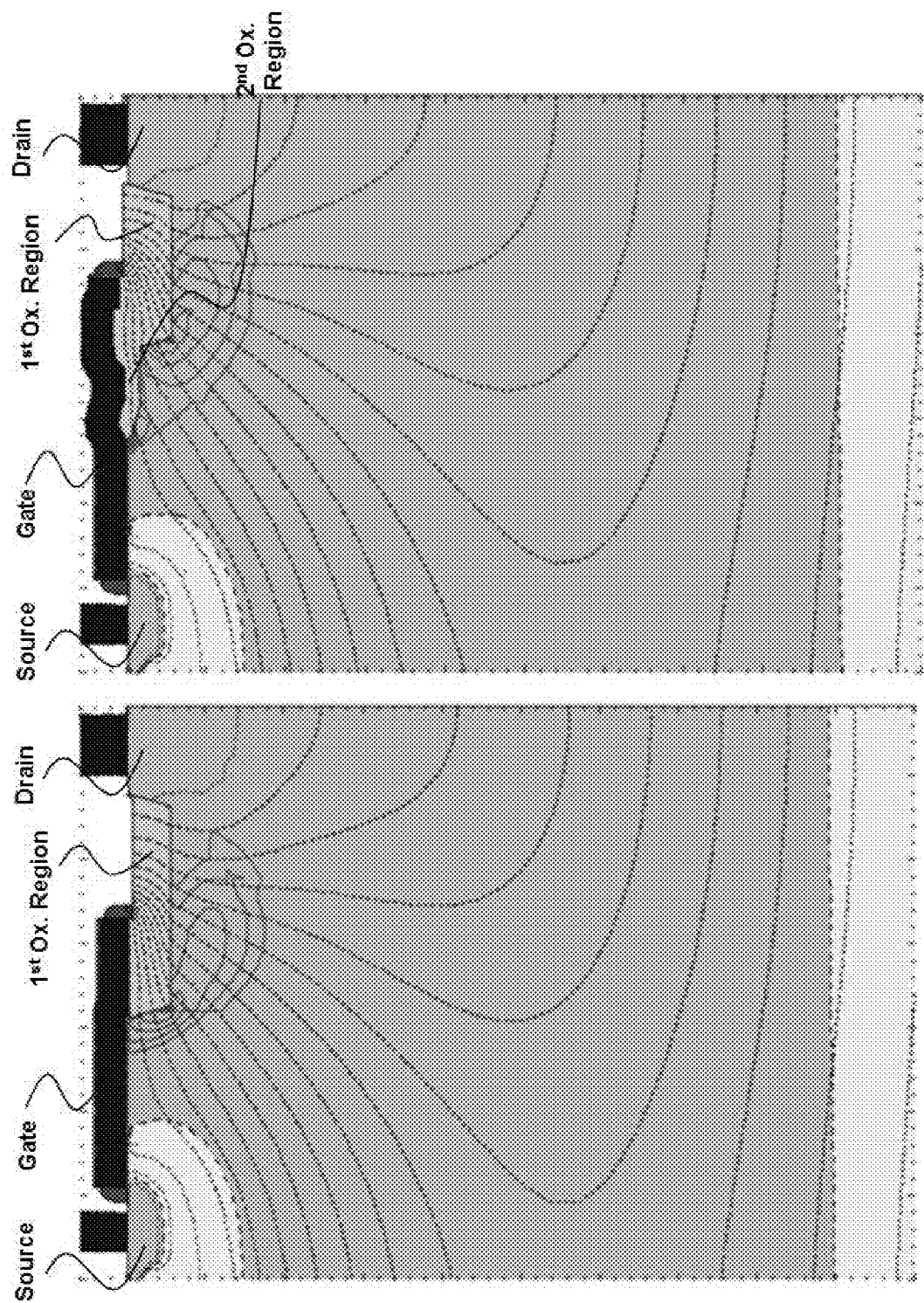
FIGS. 11A-11B show equipotential simulation diagrams of the prior art LDMOS device and the LDMOS device according to the present invention.

FIGS. 11A-11B show simulated level contours of the LDMOS devices of the prior art and the present invention in an OFF condition. The simulated level contours indicate that the LDMOS device according to the present invention has a relatively higher BV. More specifically, referring to the simulated level contours shown in FIG. 11A (prior art) and FIG. 11B (the present invention), the density of the simulated level contours below the gate of the LDMOS device of the present invention is relatively lower, which indicates that the electric field strength of the LDMOS device according to the present invention is relatively lower under the same condition, i.e., the OFF condition. Therefore, the LDMOS device according to the present invention can withstand a relatively higher voltage under the OFF condition. In other words, the LDMOS device according to the present invention has a relatively higher BV. Note that, the OFF condition of the LDMOS device refers to a condition wherein the source and the drain are electrically connected to different predetermined levels, and a gate voltage, which is applied to the gate, terminates a current flowing between the source and the drain except an extremely low leakage current.

FIGS. 12A-12B show simulated current vector contours of the LDMOS devices of the prior art and the present invention in an ON condition. The simulated current vector contours indicate that the LDMOS device according to the present invention has a relatively higher current density. More specifically, referring to the simulated current vector contours shown in FIG. 12A (prior art) and FIG. 12B (the present invention), the density of the simulated current vector contours below the gate of the LDMOS device of the present invention is relatively higher, which indicates that the current of the LDMOS device according to the present invention is relatively higher under the same condition, i.e., the ON condition. Therefore, the LDMOS device according to the present invention has a relatively higher conduction current under the ON condition. In other words, the LDMOS device according to the present invention has a relatively lower conduction resistance. The LDMOS device according to the present invention can increase the conduction current, and therefore the application range is broader.

Figure 13:
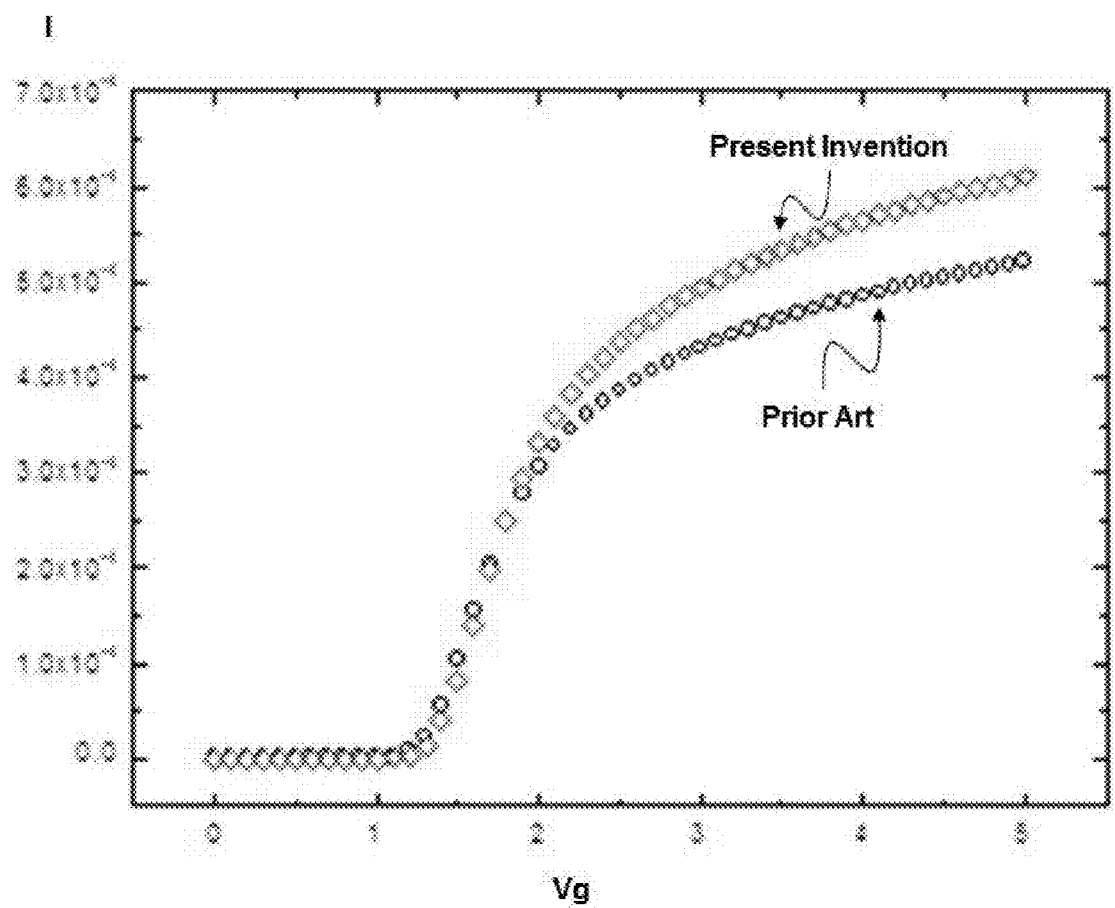
FIG. 13 shows characteristic curves of the current and the gate voltage of the prior art LDMOS device and the LDMOS device according to the present invention.

FIG. 13 shows current vs. gate voltage characteristic curves of the LDMOS devices of the prior art and the present invention. As shown in the figure, the conduction current of the LDMOS device according to the present invention in the ON condition is relatively higher. FIG. 13 indicates that the LDMOS device according to the present invention can reduce the conduction resistance, and increase the conduction current, and therefore the application range is broader.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the number of the first and second oxide regions beneath the gate may be more than two as shown in the embodiments; for another example, the lithography step described in the above can be replaced by electron beam lithography, X-ray lithography, etc.; for another example, in all the aforementioned embodiments, the conductive type of a region is not limited to the described type, such as N-type for the drift region, the source, and the drain, etc. or P-type for the substrate, the body region, and the body electrode, etc.; the conductive type may be changed to an opposite type with corresponding modifications in other regions. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A manufacturing method of a lateral double diffused metal oxide semiconductor (LDMOS) device, comprising:
   providing a substrate with a first conductive type;
   forming with a second conductive type a drift region on the substrate;
   forming an isolation oxide region on the drift region to define an operation region, wherein the operation region is located in the drift region;
   forming an oxide region on the drift region in the operation region having a first thickness by same process steps which form the isolation oxide region;
   defining a second oxide region in the oxide region by a mask layer;
   forming the second oxide region in the oxide region having a second thickness by an etching process, wherein a first oxide region is formed, which is a remaining not-etched portion of the oxide region, wherein the second oxide region is directly connected to the first oxide region in a lateral direction, wherein the second thickness is less than the first thickness;
   removing the mask layer;
   forming a gate on the drift region in the operation region, which overlays at least part of the second oxide region and part of the first oxide region, including:
      forming a dielectric layer on the drift region, which is directly connected to the second oxide region in the lateral direction, wherein the second oxide region separates the dielectric layer and the first oxide region from each other;
      forming a stack layer on the dielectric layer; and
      forming a spacer layer over a side wall of the stack layer;
   forming a body region with a first conductive type in the drift region, and part of the body region is beneath the gate;
   forming a source with the second conductive type in the body region, wherein the spacer layer is located between the source and the stack layer from a top view; and
   forming a drain with the second conductive type in the drift region, which is located between the first oxide region and the isolation oxide region;

wherein the first oxide region, the second oxide region, and the isolation oxide region are local oxidation of silicon (LOCOS) structures;

wherein the isolation oxide region, the drain, the first oxide region, the second oxide region, and the dielectric layer are sequentially connected in the lateral direction.

* * * * *